US008748878B2

(12) United States Patent
Yamaguchi et al.

(10) Patent No.: US 8,748,878 B2
(45) Date of Patent: Jun. 10, 2014

(54) THIN FILM TRANSISTOR, METHOD OF MANUFACTURING THE SAME, AND DISPLAY DEVICE

(75) Inventors: Norihiko Yamaguchi, Kanagawa (JP);
Satoshi Taniguchi, Kanagawa (JP);
Hiroko Miyashita, Kanagawa (JP);
Yasuhiro Terai, Kanagawa (JP)

(73) Assignee: Sony Corporation, Tokyo (JP)

( * ) Notice: Subject to any disclaimer, the term of this patent is extended or adjusted under 35 U.S.C. 154(b) by 137 days.

(21) Appl. No.: 12/709,805

(22) Filed: Feb. 22, 2010

(65) Prior Publication Data

US 2010/0224871 A1      Sep. 9, 2010

(30) Foreign Application Priority Data

Mar. 4, 2009   (JP) ................. P2009-050741

(51) Int. Cl.
*H01L 29/786*   (2006.01)
*H01L 21/34*    (2006.01)

(52) U.S. Cl.
USPC ............... 257/41; 257/59; 257/61; 257/408; 257/E29.296; 257/E21.46; 438/104

(58) Field of Classification Search
USPC .......... 257/43, 59, 61, 408, E29.296, E21.46; 438/104
See application file for complete search history.

(56) References Cited

U.S. PATENT DOCUMENTS 6,222,257 B1 * 4/2001 Cathey et al. ................. 257/640
6,265,247 B1 * 7/2001 Nakanishi et al. ............ 438/149
6,359,320 B1 * 3/2002 Yamazaki et al. ............ 257/408
6,465,346 B2 * 10/2002 Kim et al. ..................... 438/636
6,563,174 B2 * 5/2003 Kawasaki et al. ............ 257/350
6,600,524 B1 * 7/2003 Ando et al. .................... 349/43
7,098,983 B2 * 8/2006 Yee et al. ...................... 349/147

(Continued)

FOREIGN PATENT DOCUMENTS

| JP | 2004-273614 | 9/2004 |
| JP | 3713756 | 2/2009 |
| JP | 3913756 | 2/2009 |

OTHER PUBLICATIONS

"Processing effects on the stability of amorphous indium gallium zinc oxide thin-film transistors", J. Noncrystalline Solids, vol. 354, p. 2826-2830 (2008).

*Primary Examiner* — Lex Malsawma
*Assistant Examiner* — Sheng Zhu
(74) *Attorney, Agent, or Firm* — K&L Gates LLP

(57) ABSTRACT

The present application provides a thin film transistor and a method of manufacturing same capable of suppressing diffusion of aluminum to oxide semiconductor and selectively etching oxide semiconductor and aluminum oxide. The thin film transistor includes: a gate electrode; a channel layer whose main component is oxide semiconductor; a gate insulating film provided between the gate electrode and the channel layer; a sealing layer provided on the side opposite to the gate electrode, of the channel layer; and a pair of electrodes which are in contact with the channel layer and serve as a source and a drain. The sealing layer includes at least a first insulating film made of a first insulating material, and a second insulating film made of a second insulting material having etching selectivity to each of the oxide semiconductor and the first insulating material and provided between the first insulating film and the channel layer.

32 Claims, 13 Drawing Sheets

(56) References Cited

U.S. PATENT DOCUMENTS

| | | | |
|---|---|---|---|
| 7,205,640 B2 | 4/2007 | Yoshioka et al. | |
| 7,382,421 B2 * | 6/2008 | Hoffman et al. | 349/43 |
| 8,178,884 B2 * | 5/2012 | Ha et al. | 257/72 |
| 2007/0052025 A1 * | 3/2007 | Yabuta | 257/347 |
| 2008/0277663 A1 * | 11/2008 | Kang et al. | 257/57 |
| 2008/0296568 A1 * | 12/2008 | Ryu et al. | 257/43 |
| 2008/0308804 A1 * | 12/2008 | Akimoto et al. | 257/59 |
| 2010/0072470 A1 * | 3/2010 | Yamazaki et al. | 257/43 |
| 2010/0084649 A1 * | 4/2010 | Seo et al. | 257/43 |
| 2010/0102313 A1 * | 4/2010 | Miyairi et al. | 257/43 |
| 2010/0140612 A1 * | 6/2010 | Omura et al. | 257/43 |
| 2010/0193772 A1 * | 8/2010 | Morosawa et al. | 257/40 |

* cited by examiner

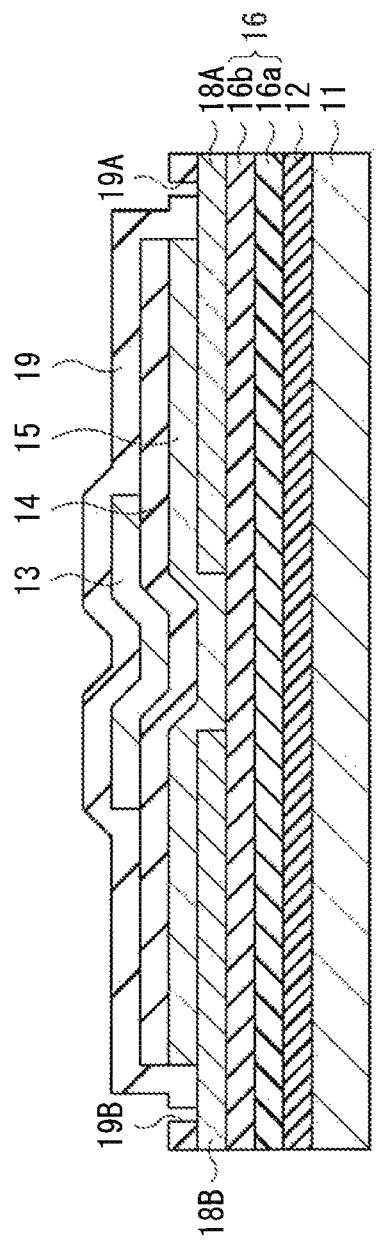
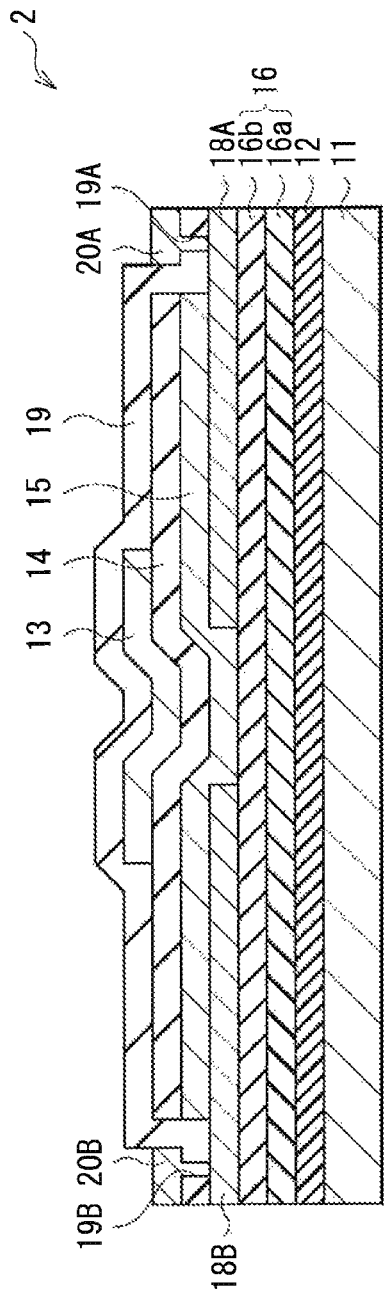
FIG. 9A
FIG. 9B

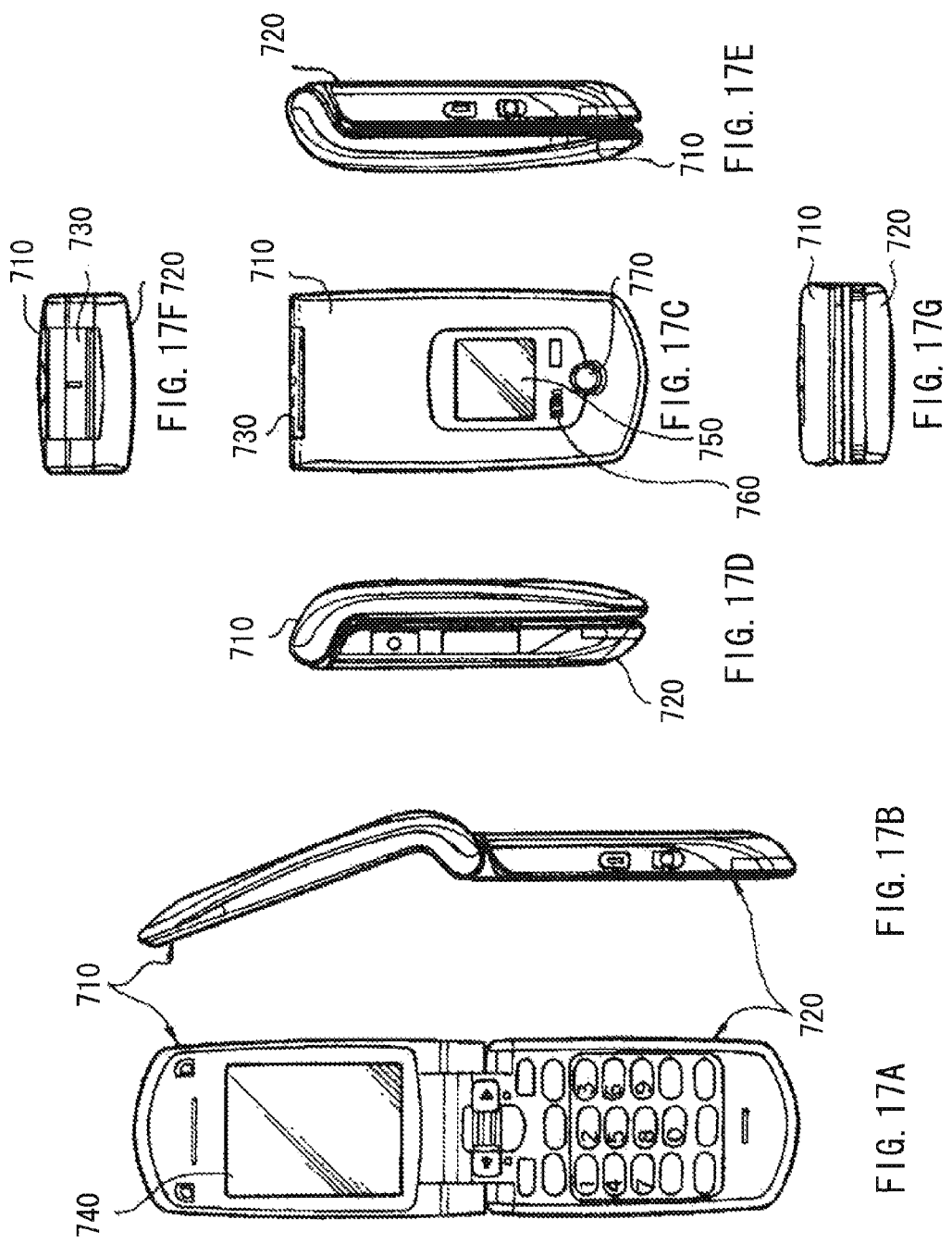

THIN FILM TRANSISTOR, METHOD OF MANUFACTURING THE SAME, AND DISPLAY DEVICE

CROSS REFERENCES TO RELATED APPLICATIONS

The present application claims priority to Japanese Priority Patent Application JP 2009-050741 filed in the Japan Patent Office on Mar. 4, 2009, the entire content of which is hereby incorporated by reference.

BACKGROUND

The present application relates to a thin film transistor (TFT) having an oxide semiconductor layer as a channel (active layer), a method of manufacturing the same, and a display device using the thin film transistor.

Oxide semiconductor such as zinc oxide, indium gallium zinc oxide (InGaAnO), or the like displays excellent property as an active layer of a semiconductor device. In recent years, the oxide semiconductor is being developed with aim for applications to a TFT, a light emitting device, a transparent conductive film, and the like. For example, a TFT using oxide semiconductor has electron mobility higher than that of a TFT using amorphous silicon (a-Si: H) which is used in an existing liquid crystal display device, and has excellent electric property. There is also an advantage that high mobility is expected even at low temperature around the room temperature.

On the other hand, it is known that, heat resistance of the oxide semiconductor is insufficient, oxygen, zinc, and the like desorbs by heat treatment in the TFT manufacturing process, and a lattice defect occurs. The lattice defect electrically causes shallow impurity level and lower resistance in an oxide semiconductor layer. Consequently, the operation becomes an operation of a normally-on type, that is, depletion-type in which drain current flows without applying gate voltage. The defect level becomes higher, the threshold voltage decreases, and leak current increases. There is consequently a disadvantage such that the characteristic fluctuation of a TFT using oxide semiconductor is large (J. Non-Crystalline Solids 354 (2008) 2826).

To address the disadvantage, a technique is being proposed that, for example, a gate insulating film which is in contact with a channel layer made of oxide semiconductor is made of amorphous aluminum oxide ($Al_2O_3$) and used as a sealing film that reduces the defect level in the interface (see, for example, Japanese Patent No. 3,913,756).

SUMMARY

When the aluminum oxide is used for the sealing film (gate insulating film), however, an issue occurs such that aluminum (Al) in the aluminum oxide is diffused in the oxide semiconductor, and the long-term property deteriorates. In addition, there is another issue that it is difficult to perform selective etching between the aluminum oxide and oxide semiconductor, process margin is narrow, and the yield is low.

It is desirable to provide a thin film transistor and a method of manufacturing the same capable of suppressing diffusion of an element of a sealing film into a channel layer (oxide semiconductor).

It is also desirable to provide a thin film transistor and a method of manufacturing the same realizing selective etching to a sealing film and a channel layer (oxide semiconductor) and to provide a display device realizing stable display by using the thin film transistor.

According to an embodiment of the present application, there is provided a thin film transistor including: a gate electrode; a channel layer whose main component is oxide semiconductor; a gate insulating film provided between the gate electrode and the channel layer; a sealing layer provided on the side opposite to the gate electrode, of the channel layer; and a pair of electrodes which are in contact with the channel layer and serve as a source and a drain. The sealing layer has a two-layer structure formed by at least: a first insulating film made of a first insulating material; and a second insulating film made of a second insulting material. The second insulating material has etching selectivity to each of the oxide semiconductor and the first insulating material and is provided between the first insulating film and the channel layer.

The oxide semiconductor is at least one of ZnO, ITO, and In-M-Zn—O (where M is at least one of Ga, Al, Fe, and Sn). For example, the first insulating material is $Al_2O_3$, and the second insulating material is at least one of $SiO_x$, $SiN_x$, $Y_2O_3$, TaO, and HfO and their oxynitrides.

In the thin film transistor, the second insulating film having etching selectivity to each of the oxide semiconductor and the first insulating material is provided between the channel layer whose main component is the oxide semiconductor and the first insulating film such as $Al_2O_3$. Therefore, diffusion into the channel layer of the element in the first insulting film is suppressed and selective etching to the first insulating film and the channel layer with the second insulting film therebetween is enabled.

A first method of manufacturing a thin film transistor according to an embodiment of the present application relates to a method of manufacturing a bottom-gate type thin film transistor and includes the following steps (elements) of:

(A1) forming a gate electrode on a substrate;

(B1) forming a gate insulating film on the gate electrode and, after that, forming a channel layer whose main component is oxide semiconductor on the gate insulating film;

(C1) forming a second insulating film made of a second insulating material and a first insulating film made of a first insulating material in this order on the channel layer;

(D1) forming a channel protection film on the first insulating film and, after that, etching the first insulating film using the second insulating film as a stopper;

(E1) etching the second insulating film using the processed first insulating film as a mask and using the channel layer as a stopper;

(F1) forming a pair of electrodes serving as a source and a drain so as to be in contact with the channel layer; and (G1) using the second insulating material having etching selectivity to each of the oxide semiconductor and the first insulating material.

A second method of manufacturing a thin film transistor according to an embodiment of the present application is provided for manufacturing a thin film transistor of a top-gate type and includes the following steps (elements):

(A2) forming a first insulating film made of a first insulting material and a second insulting film made of a second insulating material in this order on a substrate;

(B2) forming a pair of electrodes serving as a source and a drain on the second insulating film;

(C2) forming a channel layer whose main component is oxide semiconductor on the second insulating film and the pair of electrodes;

(D2) forming a gate insulating film on the channel layer and etching the channel layer using the pair of electrodes as a stopper;

(E2) forming a gate electrode on the gate insulating film; and (F2) making the second insulating material have etching selectivity to each of the oxide semiconductor and the first insulating material.

In the thin film transistor and the method of manufacturing the same of the embodiment of the invention, the second insulating film is provided between the channel layer whose main component is oxide semiconductor and the sealing film (the first insulating film), and the second insulating film has etching selectivity to each of the oxide semiconductor and the first insulating film. With the configuration, diffusion to the channel layer (oxide semiconductor), of the element of the sealing film is suppressed, and selective etching to the sealing film and the channel layer (oxide semiconductor) is enabled. Consequently, both of the sealing effect by the sealing film made of aluminum oxide or the like and improvement in yield are satisfied, and long-term property of the thin film transistor improves.

Additional features and advantages are described herein, and will be apparent from the following Detailed Description and the figures.

BRIEF DESCRIPTION OF THE FIGURES

FIGS. 9A and 9B are cross sections illustrating processes subsequent to FIGS. 8A and 8B.

FIG. 17A is a front view illustrating an open state of application example 5, FIG. 17B is a cross section, FIG. 17C is a front view illustrating a closed state, FIG. 17D is a left side view, FIG. 17E is a right side view, FIG. 17F is a top view, and FIG. 17G is a bottom view.

DETAILED DESCRIPTION

The present application will be described below with reference to the drawings according to an embodiment. The description will be given in the following order.

1. First embodiment (example of bottom-gate-type TFT)
 (1) General configuration of TFT
 (2) Manufacturing method of TFT
2. Second embodiment (example of top-gate-type TFT)
3. Configuration example of display device using TFT
4. Configuration example of modules including display device
5. Concrete application examples 1 to 5

First Embodiment

General Configuration of TFT

Figure 1:
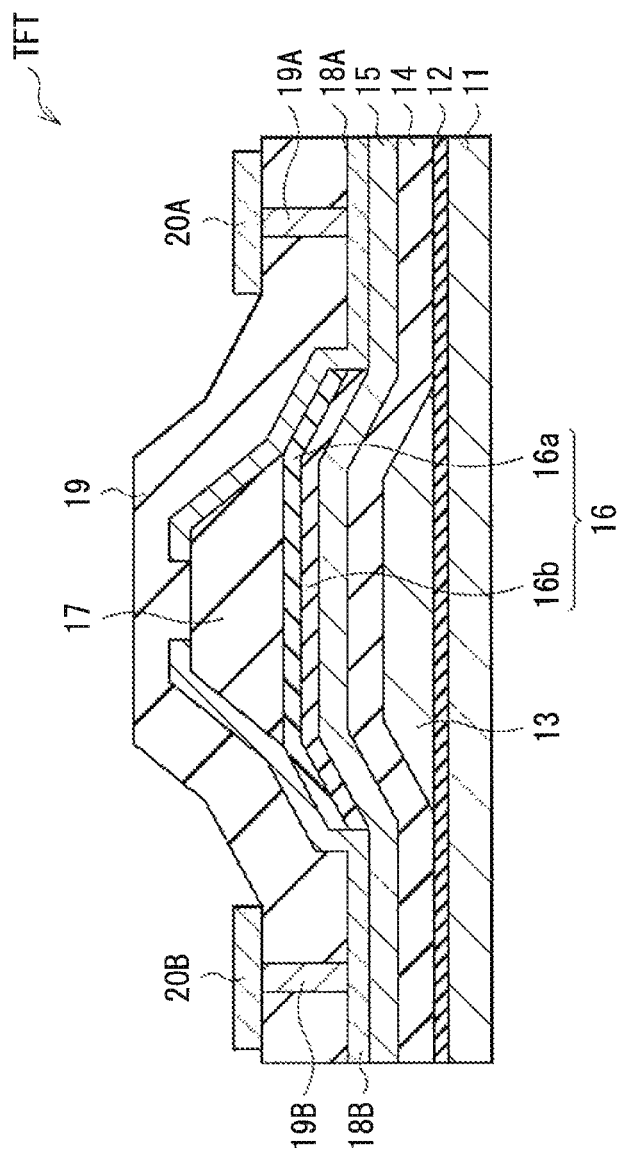
FIG. 1 is a cross section illustrating the configuration of a TFT according to a first embodiment of the present application.

FIG. 1 illustrates a sectional configuration of a bottom-gate-type thin film transistor (TFT) according to a first embodiment of the present application. A TFT 1 has, on a substrate 11 with an insulating film 12 in between, a gate electrode 13, a gate insulating film 14, a channel layer 15, and a sealing layer 16 (a first insulating film 16a and a second insulating film 16b) in this order.

The substrate 11 is, for example, a silicon substrate and may be made of another material such as quart, glass, metal, resin, resin film, or the like. The insulating film 12 is made of an insulating film material such as silicon (Si).

The gate electrode 13 controls electron density in the channel layer (oxide semiconductor layer) 15 by gate voltage applied to the TFT 1 and has a two-layer structure of, for example, a molybdenum (Mo) layer having a thickness of 50 nm and an aluminum (Al) layer or an aluminum alloy layer having a thickness of 400 nm. An example of the aluminum alloy layer is an aluminum-neodymium alloy layer.

The gate insulting film 14 is made of, for example, an insulting film material including silicon (Si) like the insulating film 12. The gate insulating film 14 covers the gate electrode 13 and is formed, for example, so as to cover the entire surface of the substrate 11 including the surface of the gate electrode 13.

The channel layer 15 is an oxide semiconductor layer containing, as a main component, conductive oxide semiconductor such as zinc oxide (ZnO), Indium Tin Oxide (ITO), or In-M-Zn—O (M is at least one of Ga, Al, Fe, and Sn).

The sealing layer 16 has a two-layer structure of, for example, the first insulating film 16a and the second insulating film 16b. The first insulating film 16a is made of aluminum oxide ($Al_2O_3$) as a main component. The first insulating film 16a suppresses desorption of oxygen or the like from the channel layer 15 whose main component is oxide semiconductor by excellent gas barrier resistance of aluminum oxide, and suppresses changes in carrier concentration in the oxide semiconductor to stabilize the electric property of the TFT 1. The thickness of the first insulating film 16a is preferably in a range of 10 nm to 500 nm both inclusive. When the film thickness is less than 10 nm, the sealing capability decreases. When the film thickness is greater than 500 nm, the etching process time becomes longer more than necessary. More preferably, the film thickness is in a range of 50 nm to 300 nm both inclusive.

The second insulating film 16b is interposed between the first insulating film 16a and the channel layer 15 and has the function of preventing diffusion of aluminum (Al) in the first insulating film 16a into the channel layer 15. The second insulating film 16b is made of a material having excellent etching selectivity to the oxide semiconductor of the channel layer 15 and the first insulating material with the same gas (or solution). Concrete examples of the oxide semiconductor as the main component are silicon oxide ($SiO_x$), silicon nitride ($SiN_x$), yttrium oxide ($Y_2O_3$), tantalum oxide ($Ta_2O_6$), and hafnium oxide ($HfO_2$).

In a region opposing the gate electrode 13 in the sealing layer 16, a channel protection film 17 made of the same material as that of the insulating film 12 is provided. In regions extending from the surface of the channel protection film 17 to the surface of the channel layer 15 via the side faces of the sealing layer 16, a pair of source and drain electrodes 18A and 18B are provided. The source and drain electrodes 18A and 18B are formed by metals such as molybdenum (Mo), aluminum, and titanium or a multilayer film of the elements.

On the sealing layer 16 and the source and drain electrodes 18A and 18B, for example, a protection film 19 made of the same material as that of the insulating film 12 is provided. The protection film 19 has through holes 19A and 19B in correspondence with the source and drain electrodes 18A and 18B, respectively. To the source and drain electrodes 18A and 18B, wirings 20A and 20B are electrically connected via the through holes 19A and 19B, respectively.

The TFT 1 is manufactured, for example, as follows.

Manufacturing Method

Figure 2A:
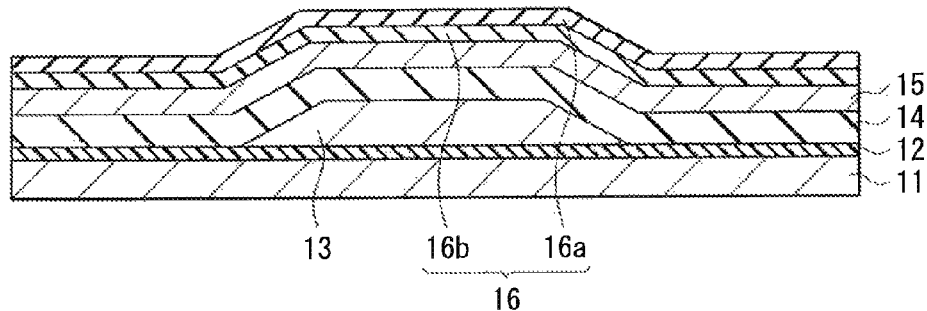
FIGS. 2A to 2C are cross sections illustrating a method of manufacturing the TFT illustrated in FIG. 1 in process order.

First, as illustrated in FIG. 2A, on the substrate 11 made of glass, SiOx is deposited by, for example, CVD (Chemical Vapor Deposition) to form the insulating film 12. Subsequently, for example, by sputtering, a molybdenum (Mo) layer is formed and, after that, the gate electrode 13 is formed by photolithography and dry etching. Next, the gate insulating film 14 is formed on the entire surface of the substrate 11 by, for example, plasma CVD. After formation of the gate insulating film 14, for example, the channel layer 15 is formed by sputtering using an oxide target of In—Ga—Zn in vacuum. Subsequently, by continuous sputtering in the same vacuum, for example, SiOx is deposited with a thickness of 10 nm as the second insulting layer 16b and, further continuously, for example, $Al_2O_3$ is deposited with a thickness of 50 nm as the first insulating layer 16a by sputtering.

Figure 2B:
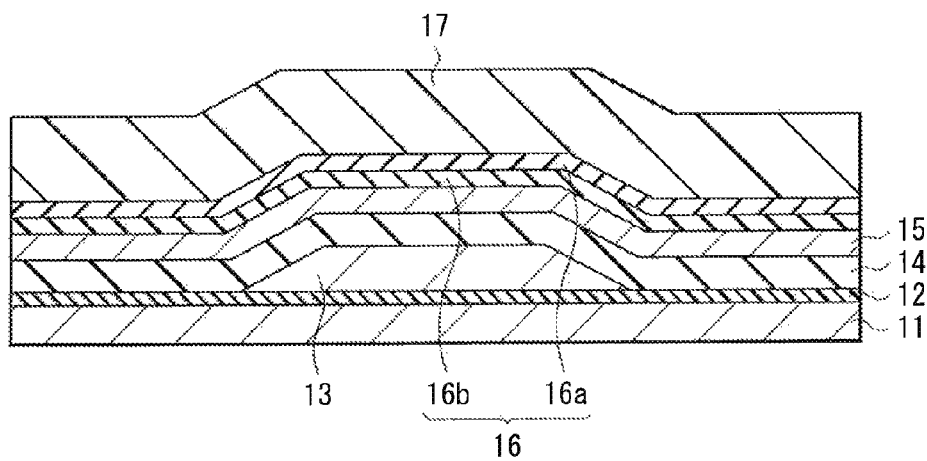
Figure 2C:
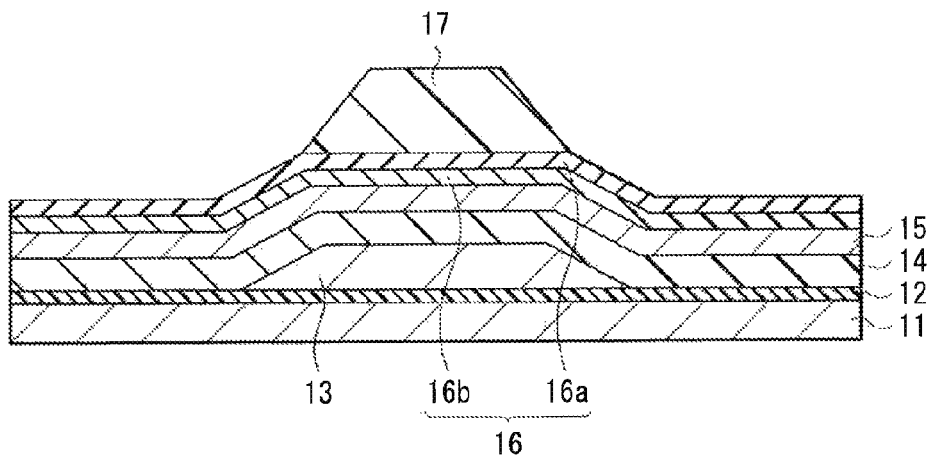

As illustrated in FIGS. 2B and 2C, for example, SiOx is deposited with a thickness of 300 nm by CVD. Subsequently, a resist (photosensitive resin film) is patterned by photolithography and SiOx is dry-etched with $C_2HF_5$ gas to which oxygen is added, thereby forming the channel protection film 17. By the etching selectivity between the first insulating film 16a ($Al_2O_3$) and the channel protection film 17 (SiOx), the first insulating film 16a becomes a stopper (etching stop layer).

Figure 3A:
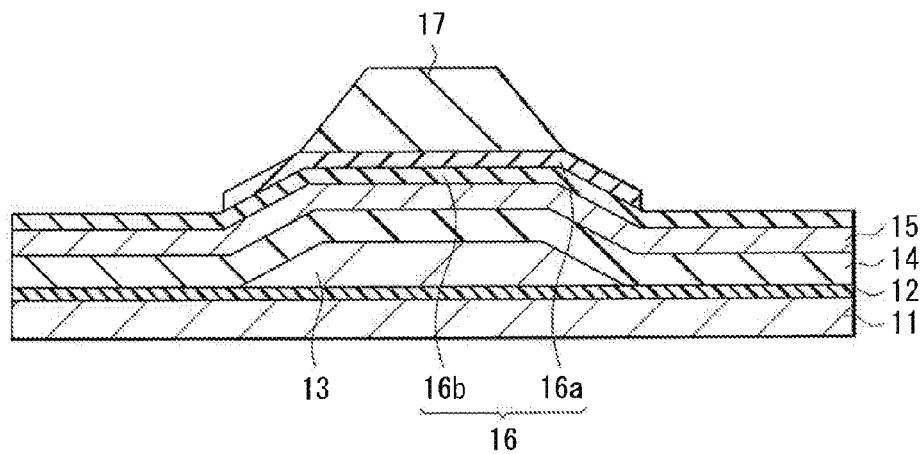
FIGS. 3A to 3C are cross sections illustrating processes subsequent to FIGS. 2A to 2C.
Figure 3B:
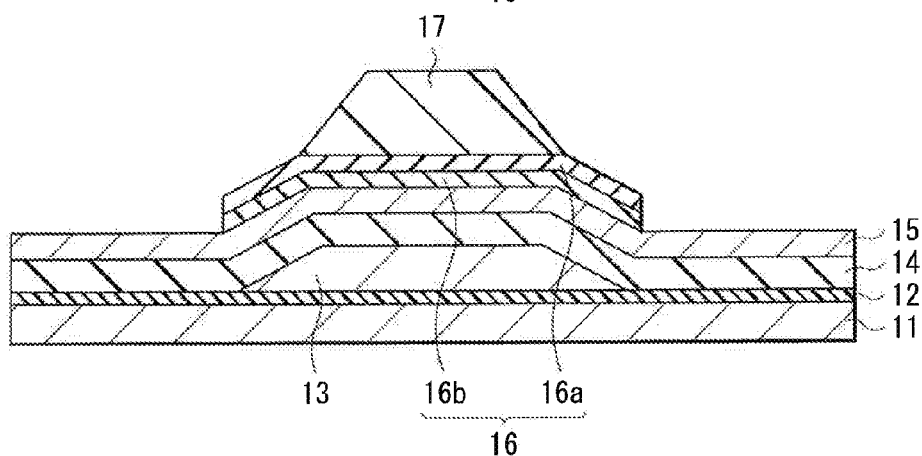

Subsequently, as illustrated in FIG. 3A, the resist is patterned by photolithography and, after that, the first insulating film 16a ($Al_2O_3$) is processed in a predetermined shape by dry etching using chlorine gas. At this time, by the etching selectivity between the first insulating film 16a and the second insulating film 16b (SiOx layer), the second insulating film 16b becomes a stopper. As illustrated in FIG. 3B, by dry etching using $C_4F_8$ gas to which hydrogen is added, the second insulating film 16b (SiOx layer) is processed. At this time, by the etching selectivity between the second insulating film 16b (SiOx layer) and the channel layer 15 (oxide layer of In—Ga—Zn), the channel layer 15 becomes a stopper. By making the second insulating film 16b interposed between the first insulting film 16a and the channel layer 15, in the embodiment, the process margin in the process of etching the channel layer 15 is widened, and the yield improves.

Next, by wet etching using dilute hydrochloric acid, the channel layer 15 is isolated transistor by transistor.

Figure 5:
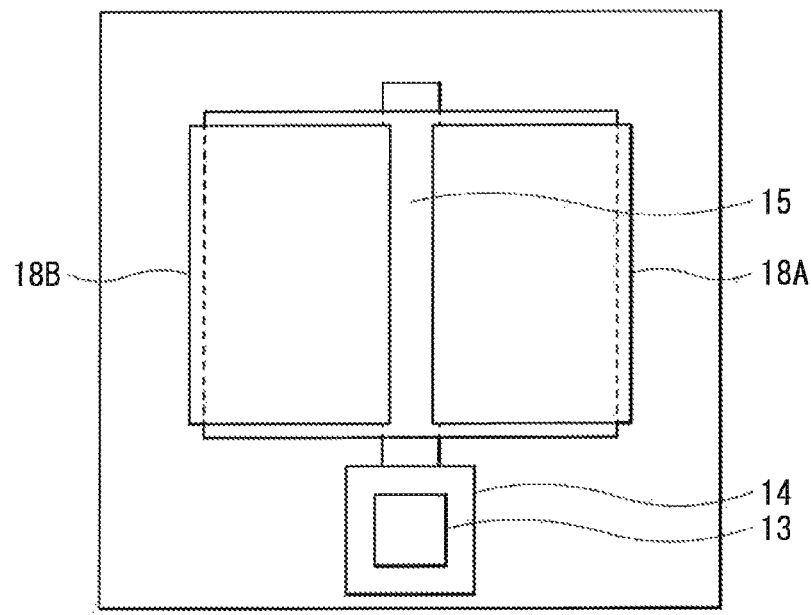
FIG. 5 is a plan view corresponding to the process of FIG. 3B.

The resist is patterned by photolithography and, after that, the channel layer 15 is selectively removed by dry etching using chlorine gas. Subsequently, by selectively removing the gate insulating film 14 by dry etching using $C_2HF_5$ gas to which oxygen is added, the gate electrode 13 in an electrode extracting part is exposed as illustrated in the plan view of FIG. 5.

Figure 3C:
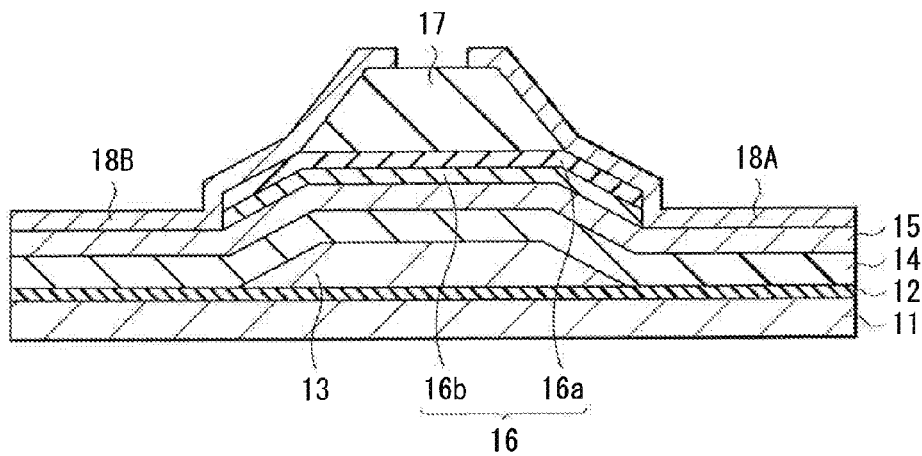

As illustrated in FIG. 3C, Mo is deposited with a thickness of 100 nm by using, for example, sputtering and the source and drain electrodes 18A and 18B are formed by dry etching using $Cl_2CF_4$ gas to which oxygen is added.

Figure 4A:
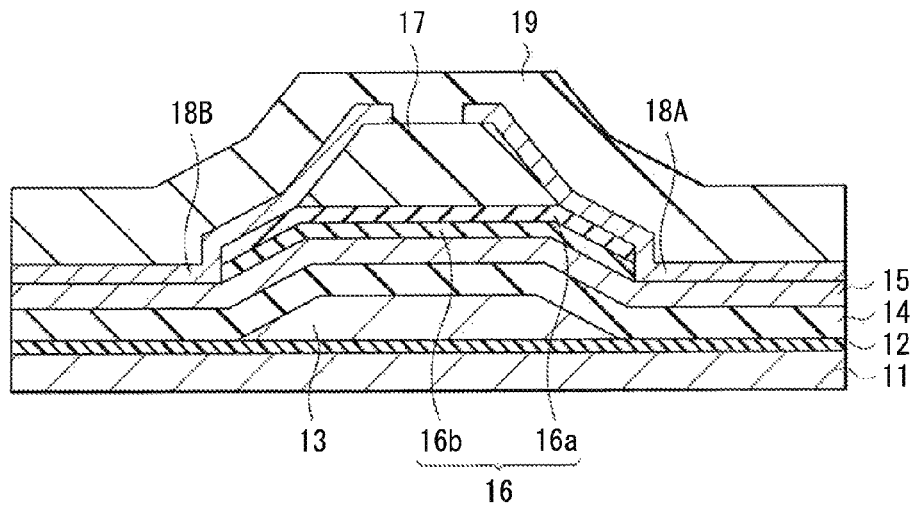
FIGS. 4A to 4C are cross sections illustrating processes subsequent to FIGS. 3A to 3C.
Figure 4B:
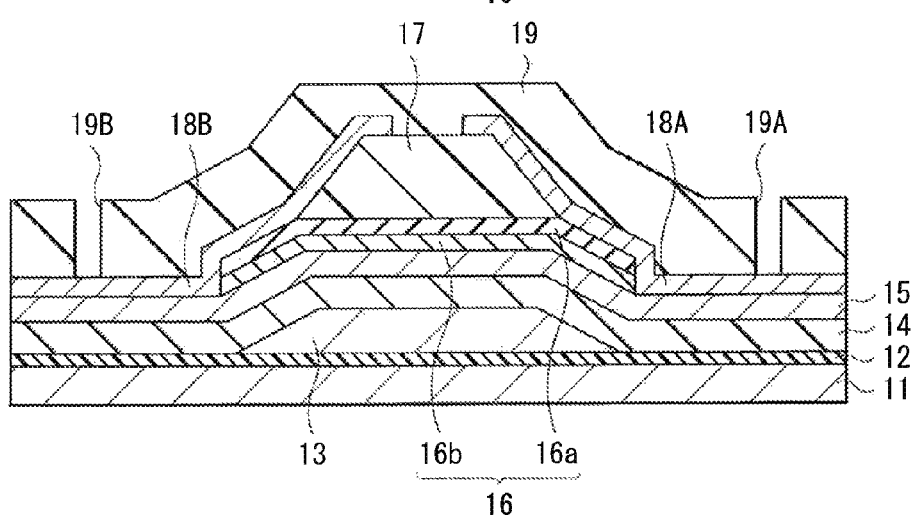
Figure 4C:
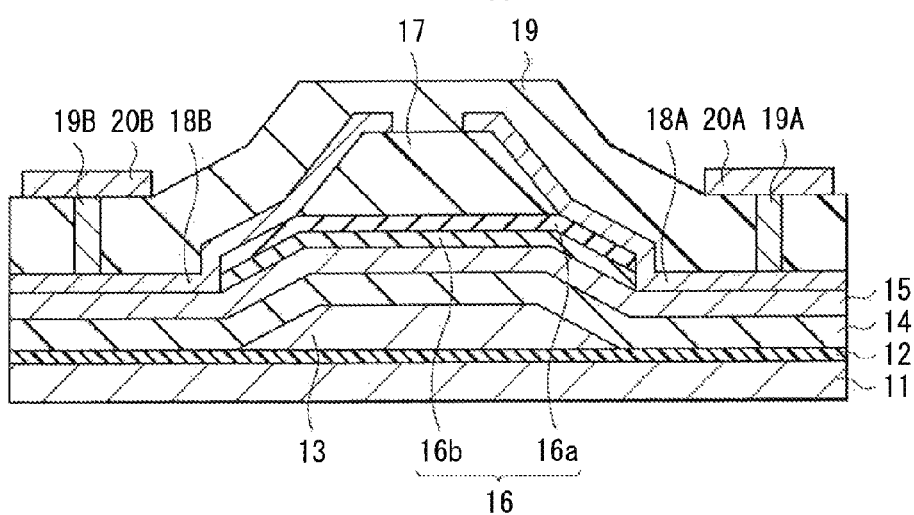
Figure 6:
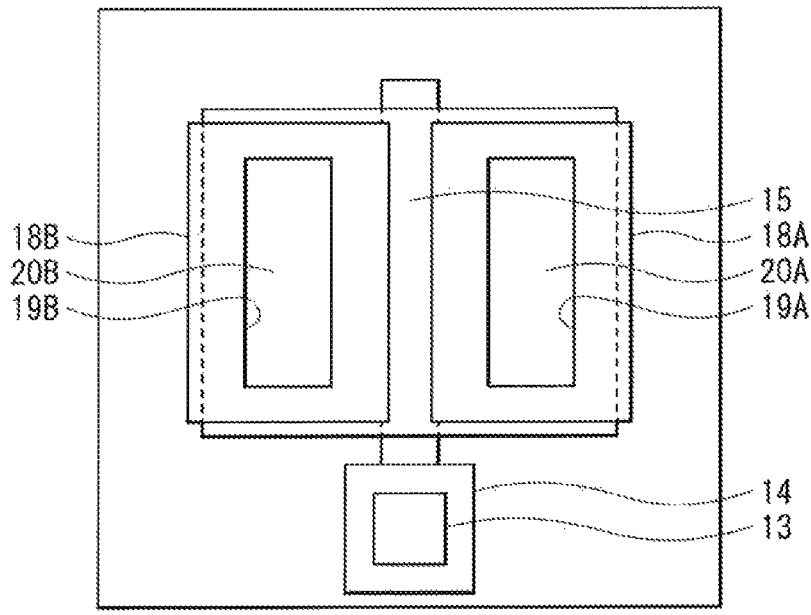
FIG. 6 is a plan view corresponding to the process of FIG. 4A.

As illustrated in FIGS. 4A and 6, a SiN film is formed on the entire surface by, for example, CVD to form the protection film 19. Subsequently, the protection film 19 (SiN) is selectively removed by dry etching using the $C_2HF_5$ gas to which oxygen is added, thereby forming the through holes 19A and 19B. After that, the wirings 20A and 20B are formed by sputtering. By the above process, the bottom-gate-type TFT 1 illustrated in FIG. 1 is completed.

In the embodiment, as the sealing layer 16 on the channel layer 15 (oxide semiconductor layer), in addition to the first insulating film 16a (aluminum oxide), the second insulating film 16b made of the insulating material (such as SiOx) other than aluminum oxide is interposed between the first insulating film 16a and the channel layer 15. By making the second insulating film 16b exist between the channel layer 15 and the first insulating film 16a, selective etching between the aluminum oxide and the oxide semiconductor is enabled. Further, by the second insulating film 16b, diffusion of aluminum in aluminum oxide into the channel layer 15 (oxide semiconductor) is prevented, and the defect level in the interface of the oxide semiconductor layer is lowered. Thus, both the sealing effect by the aluminum oxide and improvement in the yield are satisfied, and the long-term properties of the TFT are improved.

Although the example of applying the present application to the bottom-gate-type TFT has been described above, the invention is also applicable to a top-gate-type TFT. The manufacturing process of the top-gate-type TFT will be described as a second embodiment. The same reference numerals are designated to the same components as those of the foregoing embodiment, and their description will not be repeated.

Second Embodiment

The top-gate-type TFT of the second embodiment has, as illustrated in FIG. 9B, on the substrate 11 with the insulating film 12 in between, the sealing layer 16 (the first insulating film 16a and the second insulating film 16b), the channel layer 15, the gate insulting film 14, and the gate electrode 13 in this order.

Figure 7A:
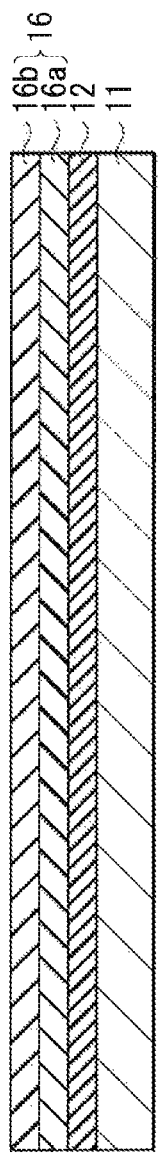
FIGS. 7A to 7C are cross sections illustrating a method of forming a TFT according to a second embodiment.
Figure 7B:
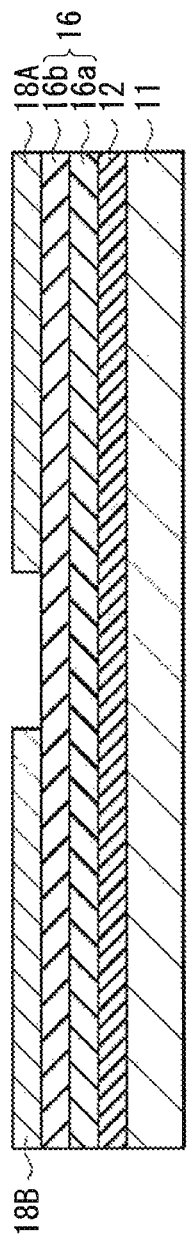
Figure 7C:
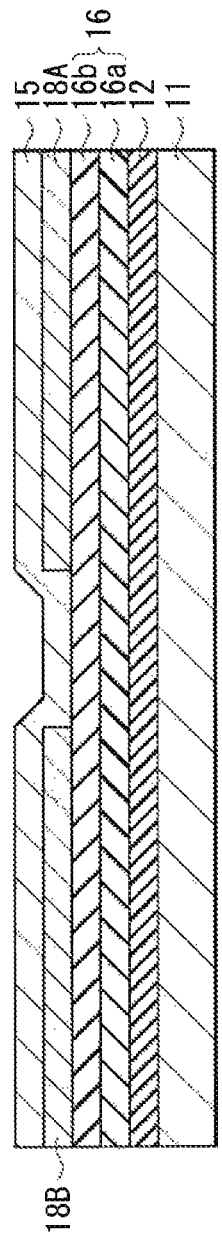

First, as illustrated in FIG. 7A, the insulating film 12 (SiOx) having a thickness of 100 nm is formed by, for example, CVD on the substrate 11 made of glass, for example, $Al_2O_3$ is deposited with a thickness of 50 nm as the first insulting film 16a and, for example, SiOx is deposited with a thickness of 100 nm as the second insulating film 16b. Subsequently, as illustrated in FIG. 7B, titanium (Ti) is deposited with a thickness of 10 nm and Mo is deposited with a thickness of 100 nm by using sputtering and, after that, the Ti/Mo film is selectively removed by dry etching using $Cl_2CF_4$ gas to which oxygen is added by photolithography. By the operation, the source and drain electrodes 18A and 18B are formed. Next, as illustrated in FIG. 7C, by sputtering using an oxide target of In—Ga—Zn, the channel layer 15 is formed on the second insulating film 16b and the source and drain electrodes 18A and 18B.

Figure 8A:
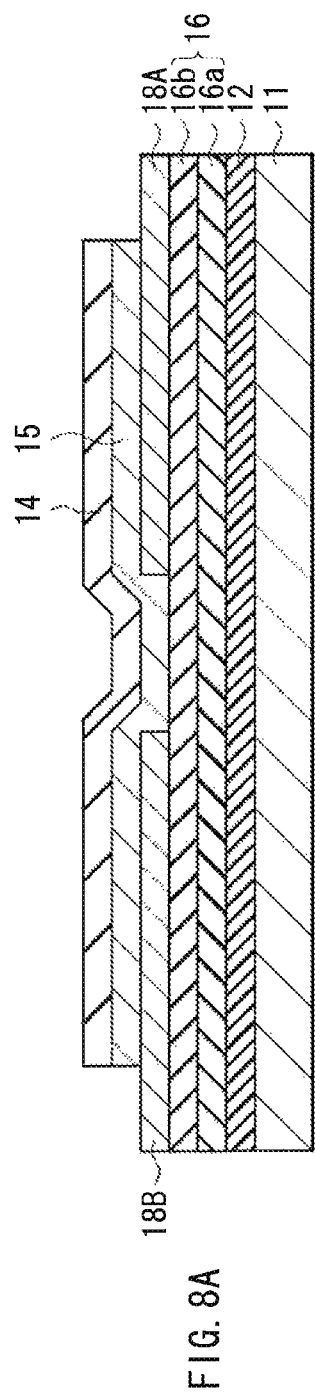
FIGS. 8A and 8B are cross sections illustrating processes subsequent to FIGS. 7A to 7C.

As illustrated in FIG. 8A, for example, by CVD, SiOx is deposited with a thickness of 300 nm, thereby forming the gate insulting film 14. Subsequently, the gate insulating film 14 (SiOx) is selective removed by dry etching using $C_2HF_5$ gas to which oxygen is added. After that, by wet etching using dilute hydrochloric acid, the channel layer 15 is isolated. By etching selectivity between the gate insulting film 14 (SiOx layer) and the channel layer 15 (the oxide layer of In—Ga—Zn), at the time of etching the gate insulating film 14, the channel layer 15 serves as a stopper. At the time of etching the channel layer 15, by etching selectivity between the channel layer 15 (the oxide layer of In—Ga—Zn) and the source and drain electrodes 18A and 18B as an underlayer, the source and drain electrodes 18A and 18B become stoppers.

Figure 8B:
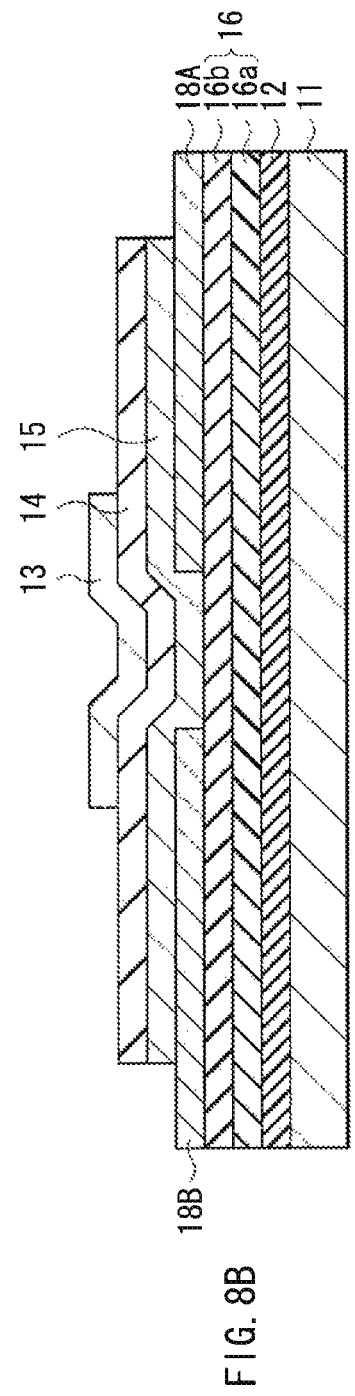

As illustrated in FIG. 8B, Ti is deposited with a thickness of 10 nm and Mo is deposited with a thickness of 100 nm by sputtering. After that, by dry etching using $Cl_2CF_4$ gas to which oxygen is added, those metal films are selectively removed, thereby forming the gate electrode 13.

Subsequently, as illustrated in FIG. 9A, $Al_2O_3$ is deposited with a thickness of 100 nm on the gate electrode 13, the gate insulating film 14, and the source and drain electrodes 18A and 18B by, for example, sputtering, thereby forming the protection film 19. Subsequently, the through holes 19A and 19B are formed by dry etching using chlorine gas and, after that, the wirings 20A and 20B are formed as illustrated in FIG. 9B. By the above process, a top-gate-type TFT 2 is completed.

In the embodiment, as the sealing layer 16 below the channel layer 15 (oxide semiconductor layer), in addition to the first insulating film 16a (aluminum oxide), the second insulating film 16b made of the insulating material (such as SiOx) other than aluminum oxide is interposed between the first insulating film 16a and the channel layer 15. By making the second insulating film 16b exist between the channel layer 15 and the first insulating film 16a, in a manner similar to the first embodiment, diffusion of aluminum in aluminum oxide into the channel layer 15 (oxide semiconductor) is prevented, and the defect level in the interface of the oxide semiconductor layer is lowered.

An application example of the thin film transistor will be described below.

Figure 10:
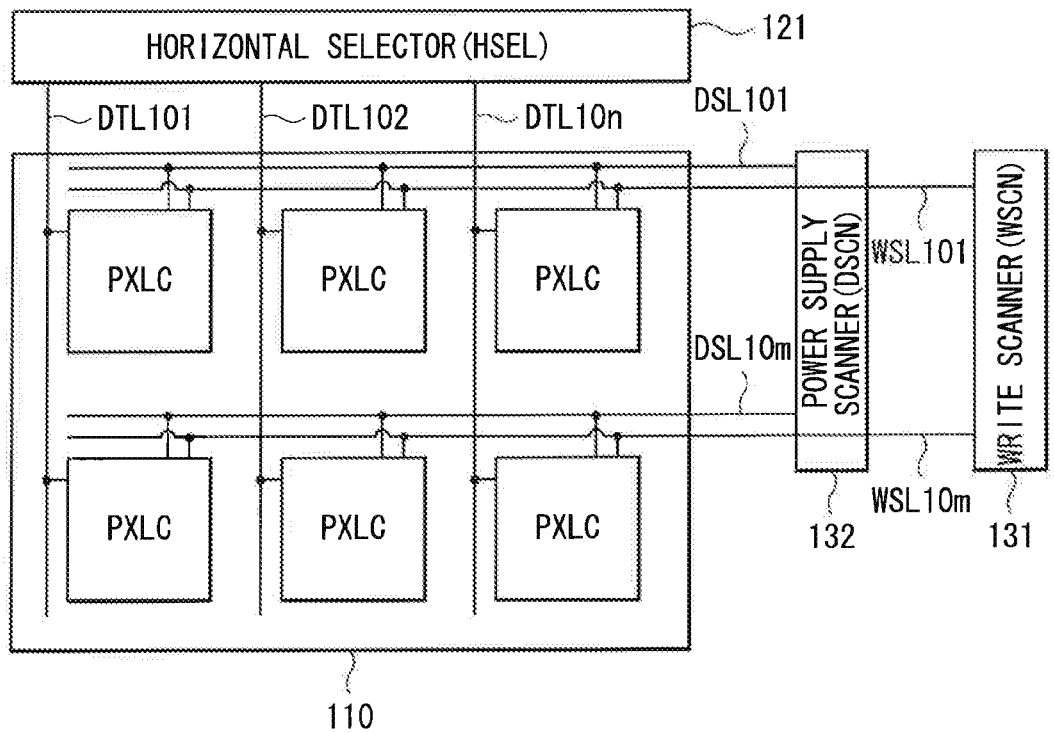
FIG. 10 is a diagram illustrating an example of the configuration of a display device.

FIG. 10 illustrates the configuration of a display device used as an ultrathin organic light emitting color display. The display device has a display region 110 in which pixels PXLC made by a plurality of organic light emitting elements 10R, 10G, and 10B which will be described later as display elements are disposed in matrix. In the periphery of the display region 110, a horizontal selector (HSEL) 121 as a signal unit, a write scanner (WSCN) 131 as a scanner unit, and a power supply scanner (DSCN) 132 are formed.

In the display region 110, signal lines DTL101 to DTL10m are disposed in the column direction, and scan lines WSL101 to WSL10m and power supply lines DSL101 to DSL10m are disposed in the row direction. At the cross point between the signal line DTL and the scan line WSL, a pixel circuit 140 including the organic light emitting element PXLC (any one of red, blue, and green (sub-pixel)) is provided. The signal lines DTL are connected to the horizontal selector 121, and a video signal is supplied from the horizontal selector 121 to the signal line DTL. The scan lines WSL are connected to the write scanner 131. The power supply lines DSL are connected to the power supply scanner 132.

Figure 11:
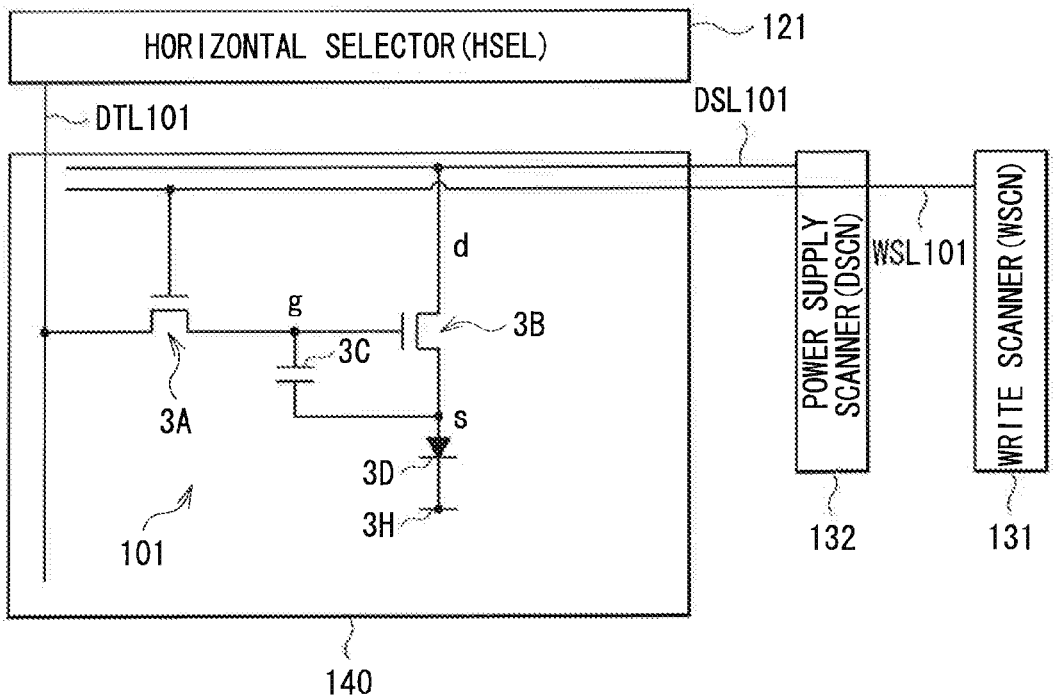
FIG. 11 is an equivalent circuit diagram illustrating an example of a pixel drive circuit illustrated in FIG. 10.

FIG. 11 illustrates an example of the pixel circuit 140. The pixel circuit 140 is an active-type drive circuit having a sampling transistor 3A, a drive transistor 3B, a retentive capacitor 3C, and a light emitting element 3D formed by the organic light emitting element PXLC. The transistors 3A and 3B are the above-described thin film transistors of the present application.

The gate of the sampling transistor 3A is connected to the scan line WSL101, one of the source and the drain of the sampling transistor 3A is connected to the signal line DTL101, the other is connected to the gate "g" of the drive transistor 3B. The drain "d" of the drive transistor 3B is connected to the corresponding power supply line DSL101, and the source "s" is connected to the anode of the light emitting element 3D. The cathode of the light emitting element 3D is connected to a grounding wiring 3H. The grounding wiring 3H is disposed commonly to all of the pixels PXLC. The retentive capacitor 3C is connected between the source "s" and the gate "g" of the drive transistor 3B.

The sampling transistor 3A is conducted in accordance with a control signal supplied from the scan line WSL101, samples the signal potential of the video signal supplied from the signal line DTL101, and retains the signal potential in the retentive capacitor 3C. The drive transistor 3B receives supply of current from the power supply line DSL101 at a first potential, and supplies the drive current to the light emitting element 3D in accordance with the signal potential retained in the retentive capacitor 3C. The light emitting element 3D emits light with luminance according to the signal potential of the video signal by the supplied drive current.

In the display device, the sampling transistor 3A is conducted according to the control signal supplied from the scan line WSL, samples the signal potential of the video signal supplied from the signal line DTL, and retains the signal potential in the retentive capacitor 3C. Current is supplied from the power supply line DSL at a first potential to the drive transistor 3B. According to the signal potential retained in the retentive capacitor 3C, the drive current is supplied to the light emitting element 3D (organic light emitting elements of red, blue, and green). Each of the light emitting elements 3D emits light with luminance according to the signal potential of the video signal by the supplied drive current.

Modules and Application Examples

Next, application examples of the display device will be described. The display device may be applied as display devices of electronic devices in all of fields for displaying a video signal entered from the outside or generated internally as an image or a video image, such as a television apparatus, a digital camera, a notebook-sized personal computer, a portable terminal device such as a cellular phone, and a video camera.

Modules

Figure 12:
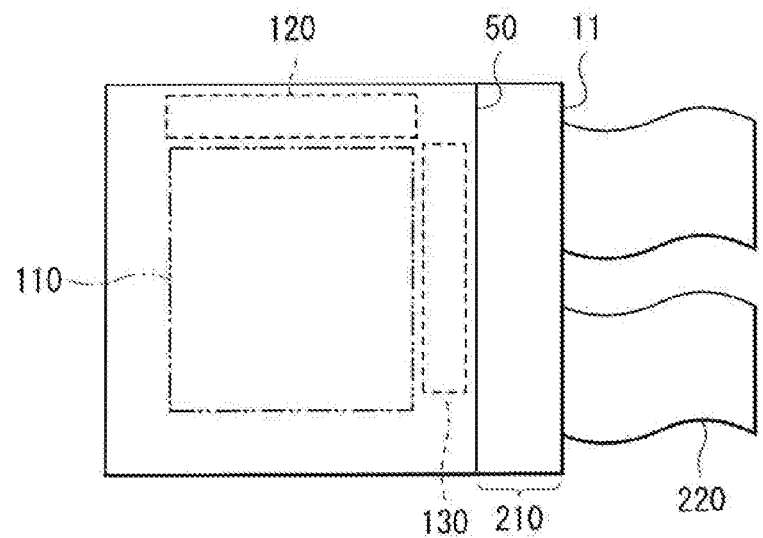
FIG. 12 is a plan view illustrating a schematic configuration of modules including the display device.

The display device of the embodiments is assembled, for example, as a module illustrated in FIG. 12, in various electronic devices in application examples 1 to 5 and the like which will be described later. The module has, for example, at one side of the substrate 11, a region 210 exposed from the sealing substrate 50 (and the adhesive layer 60). To the region 210, wirings of a signal line drive circuit 120 and a scan line drive circuit 130 are extended and external connection terminals (not illustrated) are formed. The external connection terminal may be provided with a flexible printed circuit (FPC) 220 for inputting and outputting signals.

Application Example 1

Figure 13:
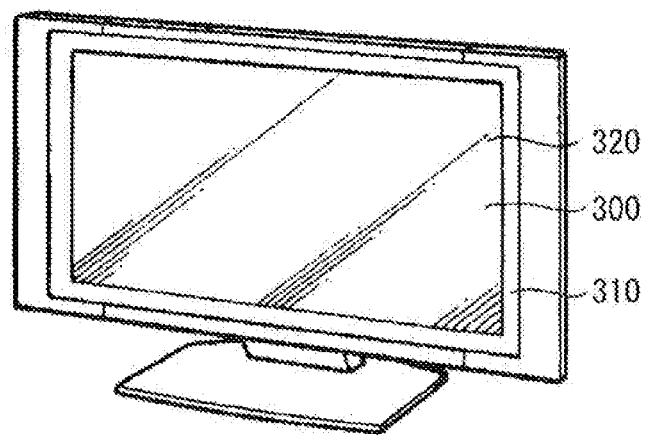
FIG. 13 is a perspective view illustrating the appearance of application example 1 of the display device.

FIG. 13 illustrates the appearance of a television apparatus to which the display device is applied. The television apparatus has, for example, a video image display screen 300 including a front panel 310 and a filter glass 320. The video display screen 300 is constructed by the display device according to any of the embodiments.

Application Example 2

Figure 14A:
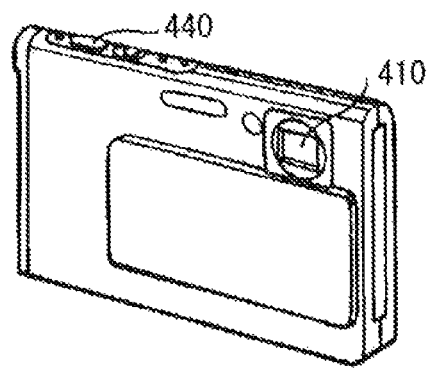
FIG. 14A is a perspective view illustrating the appearance of the surface side of application example 2.
Figure 14B:
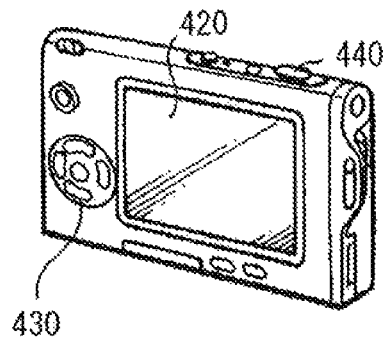
FIG. 14B is a perspective view illustrating the appearance of the back side.

FIGS. 14A and 14B illustrate the appearance of a digital camera to which the display device is applied. The digital camera has, for example, a light emission unit 410 for flash, a display unit 420, a menu switch 430, and a shutter button 440. The display unit 420 is constructed by the display device according to any of the foregoing embodiments.

Application Example 3

Figure 15:
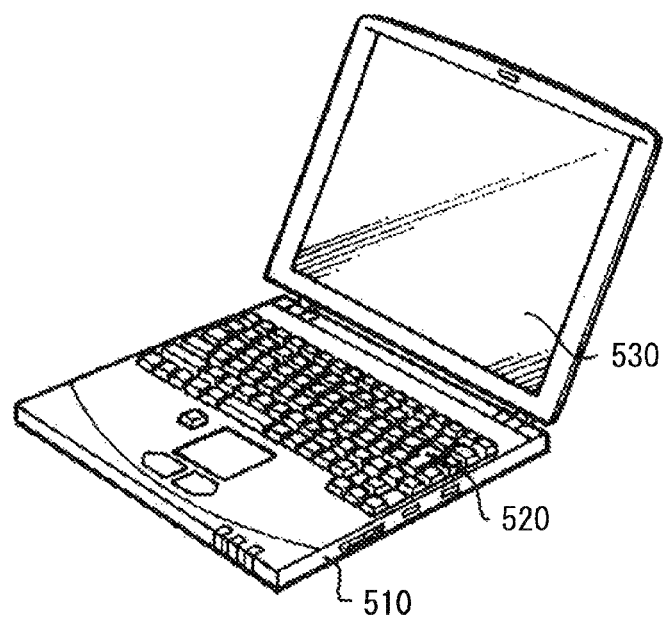
FIG. 15 is a perspective view illustrating the appearance of application example 3.

FIG. 15 illustrates the appearance of a notebook-sized personal computer to which the display device of the foregoing embodiment is applied. The notebook-sized personal computer has, for example, a body 510, a keyboard 520 for operation of entering characters and the like, and a display unit 530 for displaying an image. The display unit 530 is constructed by the display device according to any of the foregoing embodiments.

Application Example 4

Figure 16:
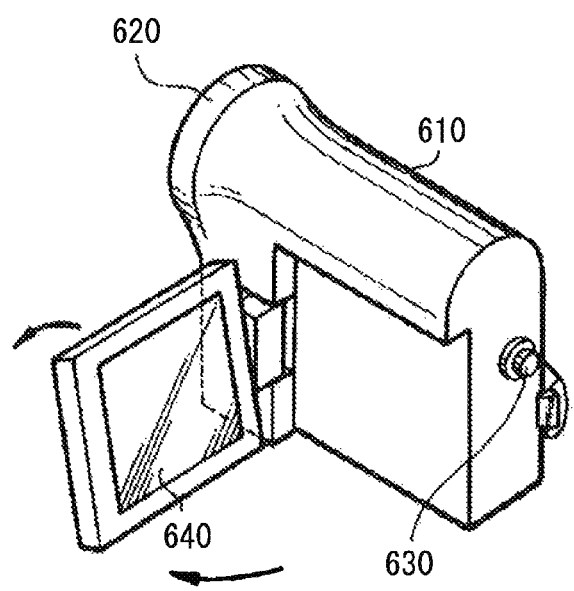
FIG. 16 is a perspective view illustrating the appearance of application example 4.

FIG. 16 illustrates the appearance of a video camera to which the display device is applied. The video camera has, for example, a body 610, a lens 620 for shooting a subject, provided on the front face of the body 610, a shooting start-stop switch 630, and a display unit 640. The display unit 640 is constructed by the display device according to any of the foregoing embodiments.

Application Example 5

FIGS. 17A to 17G illustrate the appearance of a cellular phone to which the display device is applied. The cellular phone is obtained by, for example, coupling an upper-side casing 710 and a lower-side casing 720 via a coupling unit (hinge) 730 and has a display 740, a sub-display 750, a picture light 760, and a camera 770. The display 740 or the sub-display 750 is constructed by the display device according to any of the foregoing embodiments.

The thin film transistor of the present application has been described above by the embodiments. However, the invention is not limited to the embodiments. The configuration of the thin film transistor of the present application may be freely modified as long as effects similar to those of the foregoing embodiments are obtained.

For example, in the first embodiment, the channel layer 15, the second insulting film 16b, and the first insulating film 16a are continuously formed in this order in vacuum. Only the channel layer 15 and the second insulating film 16b may be continuously formed and temporarily exposed to the atmosphere. After that, the first insulting layer 16a may be newly formed. Also after formation of the first insulating film 16a, an upper layer may be continuously formed in vacuum.

Although the case of using the aluminum oxide film as the first insulating film 16a has been described in the foregoing embodiments, for example, gallium oxide ($Ga_2O_3$) or zirconium oxide ($ZrO_2$) may be used. In this case as well, process may be performed while providing etching selectivity between the second insulating film 16b and the channel layer 15 made of oxide semiconductor.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A thin film transistor comprising:
a gate electrode;
a channel layer whose main component is oxide semiconductor;
a gate insulating film provided between the gate electrode and the channel layer;
a sealing layer provided on the side opposite to the gate electrode, of the channel layer;
a pair of electrodes formed over a portion of the sealing layer and over a portion of the gate electrode which are in contact with the channel layer and serve as a source and a drain; and
a channel protection film formed on the sealing layer such that the sealing layer is formed between the channel layer and the channel protection film,
wherein the sealing layer includes at least
a first insulating film made of a first insulating material, and
a second insulating film made of a second insulting material having etching selectivity to each of the oxide semiconductor and the first insulating material and provided between the first insulating film and the channel layer, and
wherein the first insulating material is selected from the group consisting of $Al_2O_3$, $Ga_2O_3$ and $ZrO_2$ and the second insulating material is at least one of $SiO_X$, $SiN_X$, $Y_2O_3$, TaO, HfO and oxynitrides thereof,
wherein the first insulating layer and the second insulating layer are etched during a single photolithographic process, and
wherein the channel protection film is formed on the sealing layer only in areas corresponding to the gate electrode.

2. The thin film transistor according to claim 1, wherein the oxide semiconductor is at least one of ZnO, ITO, and In-M-Zn—O where M is at least one of Ga, Al, Fe, and Sn.

3. The thin film transistor according to claim 1, wherein the gate electrode, the gate insulating film, the channel layer, and the sealing layer are provided in this order on a substrate.

4. The thin film transistor according to claim 1, wherein thickness of the first insulating film is 10 nm to 500 nm both inclusive.

5. The thin film transistor according to claim 1, wherein the second insulating material is $SiO_X$.

6. The thin film transistor according to claim 1, wherein the first insulating film suppresses desorption of oxygen from the channel layer.

7. The thin film transistor according to claim 1, wherein the second insulating film prevents diffusion of Al from the first insulating film into the channel layer.

8. The thin film transistor according to claim 1, wherein the pair of electrodes are formed in regions extending from a surface of the channel protection film to the surface of the channel layer via side faces of the sealing layer.

9. The thin film transistor according to claim 1, wherein a protection film is formed over the pair of electrodes and over an exposed portion of the channel protection film between the pair of electrodes.

10. The thin film transistor according to claim 1, wherein the first insulating film has etching selectivity to the channel protection film.

11. The thin film transistor according to claim 1, wherein the etching selectivity between the first insulating film and the second insulating film is configured such that the second insulating film is an etching stop layer for the first insulating film.

12. The thin film transistor according to claim 11, wherein the etching selectivity between the second insulating film and the channel layer is configured such that the channel layer is an etching stop layer for the second insulating film.

13. The thin film transistor according to claim 12, wherein the first insulating film is dry etched with a first etching gas, and the second insulating film is dry etched with a second etching gas that is different from the first etching gas.

14. The thin film transistor according to claim 1, wherein the etching selectivity between the first insulating film and the second insulating film is configured such that the second insulating film is an etching stop layer for the first insulating film.

15. The thin film transistor according to claim 14, wherein the etching selectivity between the second insulating film and the channel layer is configured such that the channel layer is an etching stop layer for the second insulating film.

16. The thin film transistor according to claim 15, wherein the first insulating film is dry etched with a first etching gas, and the second insulating film is dry etched with a second etching gas that is different from the first etching gas.

17. The thin film transistor according to claim 1, wherein the gate electrode has a two-layer structure including a molybdenum layer and an aluminum layer or an aluminum alloy layer.

18. The thin film transistor according to claim 17, wherein the aluminum alloy layer is an aluminum-neodymium alloy layer.

19. The thin film transistor according to claim 1, wherein the channel layer includes a conductive oxide semiconductor selected from the group consisting of zinc oxide (ZnO), Indium Tin Oxide (ITO), and In-M-Zn—O (M is at least one of Ga, Al, Fe, and Sn).

20. The thin film transistor according to claim 1, wherein a film thickness of the sealing layer ranges from 50 nm to 300 nm.

21. The thin film transistor according to claim 1, wherein the first insulating material is $Ga_2O_3$.

22. The thin film transistor according to claim 1, wherein the first insulating material is $ZrO_2$.

23. A display device comprising a thin film transistor and a display element, wherein the thin film transistor includes:
   a gate electrode;
   a channel layer whose main component is oxide semiconductor;
   a gate insulating film provided between the gate electrode and the channel layer;
   a sealing layer provided on the side opposite to the gate electrode, of the channel layer;
   a pair of electrodes formed over a portion of the sealing layer and over a portion of the gate electrode which are in contact with the channel layer and serve as a source and a drain; and
   a channel protection film formed on the sealing layer such that the sealing layer is formed between the channel layer and the channel protection film, and
   the sealing layer includes at least
      a first insulating film made of a first insulating material; and
      a second insulating film made of a second insulting material having etching selectivity to each of the oxide semiconductor and the first insulating material and provided between the first insulating film and the channel layer,
   wherein the first insulating material is selected from the group consisting of $Al_2O_3$, $Ga_2O_3$ and $ZrO_2$ and the second insulating material is at least one of $SiO_X$, $SiN_X$, $Y_2O_3$, TaO, HfO and oxynitrides thereof,
   wherein the first insulating layer and the second insulating layer are etched during a single photolithographic process, and
   wherein the channel protection film is formed on the sealing layer only in areas corresponding to the gate electrode.

24. The display device according to claim 23, wherein the etching selectivity between the first insulating film and the second insulating film is configured such that the second insulating film is an etching stop layer for the first insulating film.

25. The display device according to claim 24, wherein the etching selectivity between the second insulating film and the channel layer is configured such that the channel layer is an etching stop layer for the second insulating film.

26. The display device according to claim 25, wherein the first insulating film is dry etched with a first etching gas, and the second insulating film is dry etched with a second etching gas that is different from the first etching gas.

27. The display device according to claim 23, wherein the gate electrode has a two-layer structure including a molybdenum layer and an aluminum layer or an aluminum alloy layer.

28. The display device according to claim 27, wherein the aluminum alloy layer is an aluminum-neodymium alloy layer.

29. The display device according to claim 23, wherein the channel layer includes a conductive oxide semiconductor selected from the group consisting of zinc oxide (ZnO), Indium Tin Oxide (ITO), and In-M-Zn—O (M is at least one of Ga, Al, Fe, and Sn).

30. The display device according to claim 23, wherein a film thickness of the sealing layer ranges from 50 nm to 300 nm.

31. The display device according to claim 23, wherein the first insulating material is $Ga_2O_3$.

32. The display device according to claim 23, wherein the first insulating material is $ZrO_2$.

* * * * *